United States Patent
Drewery et al.

(10) Patent No.: US 12,406,872 B2
(45) Date of Patent: Sep. 2, 2025

(54) SEMICONDUCTOR PROCESSING CHAMBER WITH DUAL-LIFT MECHANISM FOR EDGE RING ELEVATION MANAGEMENT

(71) Applicant: Lam Research Corporation, Fremont, CA (US)

(72) Inventors: John Stephen Drewery, San Jose, CA (US); James E. Tappan, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 573 days.

(21) Appl. No.: 17/904,774

(22) PCT Filed: Feb. 22, 2021

(86) PCT No.: PCT/US2021/019099
§ 371 (c)(1),
(2) Date: Aug. 22, 2022

(87) PCT Pub. No.: WO2021/173498
PCT Pub. Date: Sep. 2, 2021

(65) Prior Publication Data
US 2022/0415702 A1    Dec. 29, 2022

Related U.S. Application Data

(60) Provisional application No. 62/705,216, filed on Jun. 16, 2020, provisional application No. 62/980,901, filed on Feb. 24, 2020.

(51) Int. Cl.
*H01L 21/687*      (2006.01)
*H01J 37/32*       (2006.01)

(52) U.S. Cl.
CPC .. *H01L 21/68742* (2013.01); *H01J 37/32623* (2013.01); *H01J 37/32642* (2013.01); *H01L 21/68735* (2013.01)

(58) Field of Classification Search
CPC ............ C23C 16/4585; H01J 37/32623; H01J 37/32642; H01J 37/32715; H01L 21/68735; H01L 21/68742
See application file for complete search history.

(56) References Cited

U.S. PATENT DOCUMENTS 6,044,534 A * 4/2000 Seo .................. H01L 21/68742
29/25.01
2006/0156981 A1   7/2006 Fondurulia et al.
(Continued)

FOREIGN PATENT DOCUMENTS

JP      H0774155 A    3/1995
JP      H09162258 A   6/1997
(Continued)

OTHER PUBLICATIONS

JP Notice of Allowances dated Oct. 22, 2024 in JP Application No. 2022-550738 with English translation.
(Continued)

*Primary Examiner* — Benjamin Kendall
(74) *Attorney, Agent, or Firm* — Weaver Austin Villeneuve & Sampson LLP

(57) ABSTRACT

Systems and techniques for providing for semiconductor processing chambers configured for use with two concentric edge rings with dual-lift mechanisms are disclosed. The dual-lift mechanisms may each have a first lifter structure and a second lifter structure which may be each at least partially independently actuatable. The first lifter structure may be used to move a lower edge ring of the edge rings between two or more vertically offset positions, and the second lifter structure may be used to raise and lower an (Continued)

upper edge ring of the edge rings. The dual-lift mechanism may be interfaced to the chamber housing of the semiconductor processing chamber.

20 Claims, 11 Drawing Sheets

(56) References Cited

U.S. PATENT DOCUMENTS

| | | | |
|---|---|---|---|
| 2019/0013232 A1 | 1/2019 | Yan et al. | |
| 2020/0234981 A1* | 7/2020 | Schmid | H01L 21/68785 |
| 2021/0066052 A1* | 3/2021 | Emura | H01L 21/68742 |

FOREIGN PATENT DOCUMENTS

| | | |
|---|---|---|
| JP | 2005203490 A | 7/2005 |
| JP | 2014165182 A | 9/2014 |
| JP | 2014232884 A | 12/2014 |
| JP | 2016146472 A | 8/2016 |
| JP | 2019114790 A | 7/2019 |

OTHER PUBLICATIONS

KR Office Action dated Jan. 9, 2025 in KR Application No. 10-2022-7033077 with English Translation.
International Preliminary Report on Patentability dated Sep. 9, 2022, in PCT Application No. PCT/US2021/019099.
International Search Report and Written Opinion dated Jun. 14, 2021, in Application No. PCT/US2021/019099.

\* cited by examiner

SEMICONDUCTOR PROCESSING CHAMBER WITH DUAL-LIFT MECHANISM FOR EDGE RING ELEVATION MANAGEMENT

RELATED APPLICATIONS

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Some semiconductor processing chambers utilize edge rings, which are generally annular in shape and have circular openings in the middle that are sized slightly larger or slightly smaller than the diameter of the wafers that the semiconductor processing chambers are configured to process. Such edge rings are typically provided to manage or better control edge-located non-uniformities that may arise during processing of the wafers.

Semiconductor processing chambers perform treatments on substrates such as semiconductor wafers ("substrate," "wafer," and "semiconductor wafer" may be used interchangeably herein). Examples of substrate treatments include deposition, aching, etching, cleaning and/or other processes. Process gas mixtures may be supplied to the processing chamber to treat the substrate. Plasma may be used to ignite the gases to enhance chemical reactions.

A substrate is arranged on a substrate support or wafer support during treatment. An edge ring may be placed around and adjacent to an outermost edge of the substrate. The edge ring may be used to shape or focus the plasma onto the substrate. During operation, the substrate and an exposed surface of the edge ring are etched by the plasma. As a result, the edge ring wears and the effect of the edge ring on the plasma changes over time.

SUMMARY

Details of one or more implementations of the subject matter described in this specification are set forth in the accompanying drawings and the description below. Other features, aspects, and advantages will become apparent from the description, the drawings, and the claims.

In some new types of semiconductor processing systems, such as those described in U.S. Prov. Pat. Appl. Nos. 62/882,890 (filed Aug. 5, 2019) and 62/976,088 (filed Feb. 13, 2020) (which are both hereby incorporated herein by reference in their entireties), the semiconductor processing systems may include a semiconductor processing chamber or chambers that include multiple edge rings (per chamber or per station). In such systems, a top or upper edge ring may be provided that is directly exposed to the processing chamber environment; a second edge ring, e.g., a lower or bottom edge ring, may also be provided that may be moved relative to the upper edge ring to allow for fine-tuning of capacitive coupling between the lower edge ring and the upper edge ring and, by way of the lower edge ring, the upper edge ring and the wafer support.

The upper edge ring in some such systems may be periodically replaced as it wears down due to exposure to wafer processing environments. Such replacement may entail lifting the upper edge ring off of the portion of the wafer support (or surrounding structure) on which it may normally rest using a plurality of lift pins or other, similar lifter structures. Lifter structures are typically provided by long, thin pins (typically made of a non-conductive or dielectric material) that may be extended or retracted along a vertical axis. The lifter structures for an upper edge ring are typically positioned at three generally equidistantly spaced locations (although not necessarily equidistantly spaced—any three or more points that provide a stable support for lifting the upper edge ring may be used) along a circle centered on the wafer support area and having a diameter larger than that of the wafers process by such systems and smaller than the outer nominal diameter of that upper edge ring. Each such lifter structure may be connected with an actuator; the actuator may then be controlled to cause such lifter structures to move upwards or downwards in unison. During upper edge ring removal and replacement operations, the lifter structures for the upper edge ring may be actuated such that contact surfaces of those lifter structures come into contact with the underside of the upper edge ring and then push the upper edge ring vertically upwards by a sufficient distance that a wafer handling robot may be controlled to insert an end effector under the upper edge ring, e.g., in between the lifted upper edge ring and the wafer support or wafer pedestal. The lifter structures for the upper edge ring may then be retracted, lowering the upper edge ring onto the wafer handling robot end effector. This same process may be performed in reverse to swap a new upper edge ring in place of the removed one.

Such systems may also provide separate lifter structures that may be used to move the lower edge ring between different heights. Such vertical movement is typically much smaller in magnitude than the vertical movement performed on the upper edge ring during replacement thereof and is performed to fine-tune various operational parameters of the semiconductor processing station during use, such as the degree of capacitive coupling between the edge rings and the wafer support. Such fine-tuning movement may only involve very slight movements, e.g., less than about 5 mm, and may occur within an annular region beneath, and capped by, the upper edge ring. Thus, the lower edge ring may be moved up and down relative to both the upper edge ring and the wafer support without movement of either of those components. The lower edge ring may, in some instances, normally not require regular replacement during normal operation of the processing chamber, and the lifter structures therefor may thus not require the movement range of the lifter structures for the upper edge ring.

The present inventors conceived of dual-lifter mechanisms for use with such systems; such dual-lifter mechanisms provide a single mounting interface for two different lifter structures, a first lifter structure and a second lifter structure, that are each respectively configured to move the lower edge ring or the upper edge ring. In some implementations, the single mounting interface may be provided by a common flange structure that mounts to a single location on a semiconductor processing chamber but provides a leak-tight seal for both lifter structures. This reduces the packaging volume needed to support both lifter structures and reduces the chances of leakage due to faulty component installation. In some implementations, the two lifter structures of such a dual-lift mechanism may be equipped with two different actuators—an electromechanically driven linear actuator capable of precise linear translation control for use in actuating the lifter structure used for fine positioning of the lower edge ring, and a pneumatically driven linear actuator used to move the upper edge ring to an elevated position for replacement. In such implementations, the pneumatically driven actuator may generally only be accurately controlled so as to move between two extremes—fully extended or fully retracted. For upper edge ring replacement operations, precise control of vertical elevation may generally not be needed, so using a pneumatically driven lifter structure for such purposes may be a cost-effective solution for obtaining the needed vertical displacement. However, it will be recognized that other technologies may be used for such lifter structure movement, e.g., an electromechanical actuator, such as may be used for actuating the lifter structure used for fine-tuning of the elevation of the lower edge ring.

Details of one or more implementations of the subject matter described in this specification are set forth in the accompanying drawings and the description below. Other features, aspects, and advantages will become apparent from the description, the drawings, and the claims.

Another potential dual-lift mechanism that may be used is one in which the dual-lift mechanism uses a single actuator to actuate the lifter structures for both the upper and lower edge rings. In such implementations, the lifter structures may be part of an integrated assembly and may be configured such that both lifter structures move in unison for some portion of the translation of the lifter structure for the upper edge ring and such that the lifter structure for the upper edge ring is able to move by itself, i.e., without movement of the lifter structure for the lower edge ring, for another portion of the travel of the lifter structure for the upper edge ring. Some such dual-lift mechanisms may be configured such that only one of the two edge rings is in motion at any given time, although other such dual-lift mechanisms may be configured such that there may be some range of motion of the lifter structures that occurs when both edge rings may be in motion simultaneously.

In some implementations, an apparatus may be provided that includes a semiconductor processing chamber, a wafer support surface located within the semiconductor processing chamber, and one or more dual-lift mechanisms. Each dual-lift mechanism may include a first lifter structure having a first contact surface, a second lifter structure having a second contact surface, a common flange structure, and one or more actuators. In such apparatuses, the one or more actuators of each dual-lift mechanism may each be mounted to the common flange structure of that dual-lift mechanism and the one or more actuators of each dual-lift mechanism may be configured to be actuatable so as to: cause the first lifter structure of that dual-lift mechanism to translate along a first axis perpendicular to the wafer support surface such that the first contact surface of that first lifter structure is moved between a first elevation and a second elevation, cause the second lifter structure of that dual-lift mechanism to translate along the first axis such that the second contact surface of that second lifter structure is moved between a third elevation and a fourth elevation, and allow the second lifter structure of that dual-lift mechanism to be translated at least partially along the first axis without simultaneous translation of the first lifter structure of that dual-lift mechanism along the first axis. In such implementations, the wafer support surface may also have an outer perimeter, and each dual-lift mechanism may be positioned such that the first lifter structure and the second lifter structure thereof are positioned outside of the outer perimeter.

In some implementations, the apparatus may further include an upper edge ring and a lower edge ring. In such implementations, the upper edge ring, when viewed along the first axis, may overlap, and be concentric with, the lower edge ring, the upper edge ring may have an inner diameter larger than an outer diameter of the wafer support surface, the first contact surface of the first lifter structure of each dual-lift mechanism may be in contact with the lower edge ring when that dual-lift mechanism is actuated to cause the first contact surface thereof to be at the first elevation, and the second contact surface of the second lifter structure of each dual-lift mechanism may be in contact with the upper edge ring when that dual-lift mechanism is actuated to cause the second contact surface thereof to be at the fourth elevation.

In some implementations, a first distance between the first elevation and the second elevation is smaller than a second distance between the third elevation and the fourth elevation.

In some implementations, each dual-lift mechanism may be connected to the semiconductor processing chamber by the common flange structure thereof.

In some implementations, the one or more actuators of each dual-lift mechanism may include a first actuator and a second actuator, the first actuator of that dual-lift mechanism may be configured to translate the first lifter structure along the first axis when actuated, the second actuator of that dual-lift mechanism may be configured to translate the second lifter structure along the first axis when actuated, the common flange structure of that dual-lift mechanism may have a first side with a first aperture extending therethrough and a second aperture extending therethrough, the first side of the common flange structure of that dual-lift mechanism may be mated against a portion of the semiconductor processing chamber, the first actuator of that dual-lift mechanism may be positioned within the first aperture of the common flange structure of that dual-lift mechanism, and the second actuator of that dual-lift mechanism may be positioned within the second aperture of the common flange structure of that dual-lift mechanism.

In some such implementations, the first actuator of each dual-lift mechanism may be an electromechanical actuator and the second actuator of that dual-lift mechanism is a pneumatic actuator.

In some other or additional such implementations of the apparatus, the first actuator of each dual-lift mechanism may be a screw actuator driven by an electric motor.

In some implementations of the apparatus, there may be three dual-lift mechanisms arranged along a circle encircling the wafer support surface.

In some such implementations, each dual-lift mechanism may be oriented such that the first lifter structure of that dual-lift mechanism and the second lifter structure of that dual-lift mechanism both lie within an annular area that is concentric with the circle and that has an annular radial width that is smaller than a diameter of a smallest circle that circumscribes the first lifter structure of that dual-lift mechanism and the second lifter structure of that dual-lift mechanism.

In some implementations of the apparatus, each dual-lift mechanism may be oriented such that a first reference plane passing through the first lifter structure of that dual-lift mechanism and the second lifter structure of that dual-lift mechanism is parallel to a second reference plane that is tangent to the circle and parallel to the first axis.

In some implementations of the apparatus, the first lifter structure and the second lifter structure of each dual-lift mechanism may be coaxial with each other.

In some such implementations, the first lifter structure of each dual-lift mechanism may have a hole extending therethrough along the first axis and the second lifter structure of that dual-lift mechanism may pass through the hole in the first lifter structure of that dual-lift mechanism.

In some implementations of the apparatus, each dual-lift mechanism may include a spring and, for each dual-lift mechanism, the spring of that dual-lift mechanism may be configured to exert a force on the first lifter structure of that dual-lift mechanism for at least some portion of the distance traversed by the first lifter structure of that dual-lift mechanism when translated such that the first contact surface of that first lifter structure is moved from the first elevation to the second elevation, and the force exerted by the spring of that dual-lift mechanism may urge the first lifter structure of that dual-lift mechanism towards the second elevation.

In some implementations of the apparatus, the spring of each dual-lift mechanism may be configured to exert the force on the first lifter structure of that dual-lift mechanism for all of the distance traversed by the first lifter structure of that dual-lift mechanism when translated such that the first contact surface of that first lifter structure is moved from the first elevation to the second elevation.

In some implementations of the apparatus, the second lifter structure of each dual-lift mechanism may include a stop surface that is sized to prevent the first lifter structure of that dual-lift mechanism from moving past a first position relative to the second lifter structure of that dual-lift mechanism.

In some implementations of the apparatus, the first lifter structure of each dual-lift mechanism may include a stop surface that is sized to prevent the first lifter structure of that dual-lift mechanism from moving past a first position relative to the common flange structure.

In some implementations of the apparatus each dual-lift mechanism may further include a spring, the first lifter structure of that dual-lift mechanism may be a tube with a flanged end, the first lifter structure of that dual-lift mechanism may have a hole through the tube that has a first interior diameter, the second lifter structure for that dual-lift mechanism may be a cylindrical rod having a first portion with a first diameter that is larger than the first interior diameter of the first lifter structure of that dual-lift mechanism and a second portion with a second diameter that is smaller than the first interior diameter of the first lifter structure of that dual-lift mechanism, and the second portion of the second lifter structure of that dual-lift mechanism may pass through the hole in the first lifter structure of that dual-lift mechanism and through the spring of that dual-lift mechanism.

In some implementations of the apparatus, the spring of each dual-lift mechanism may be compressed between the first lifter structure of that dual-lift mechanism and a surface that is fixed with respect to the common flange structure such that the first lifter structure of that dual-lift mechanism is continually pressed into contact with the first portion of the second lifter structure of that dual-lift mechanism when the first lifter structure and the second lifter structure of that dual-lift mechanism are translated such that the first contact surface of the first lifter structure of that dual-lift mechanism is moved from the first elevation to the second elevation.

In some implementations of the apparatus, the one or more actuators for each dual-lift mechanism may be a single actuator.

In some such implementations of the apparatus, the single actuator of each dual-lift mechanism may be a screw actuator driven by a corresponding electric motor.

These and other aspects of the dual-lift mechanisms are discussed below with respect to the Figures.

BRIEF DESCRIPTION OF THE DRAWINGS

FIG. 1-2 depicts an example electromechanical lifter structure actuator.

FIG. 1-3 depicts an example dual-lift mechanism featuring a common flange structure, a pneumatic lifter structure actuator, and an electromechanical lifter structure actuator.

FIGS. 2-1 and 2-2 depict, respectively, top and side section views of a common flange structure.

FIG. 3 is a cross-sectional diagram of a portion of an example semiconductor processing chamber with a dual-lift mechanism.

DETAILED DESCRIPTION

Figures 1, 2, 3:
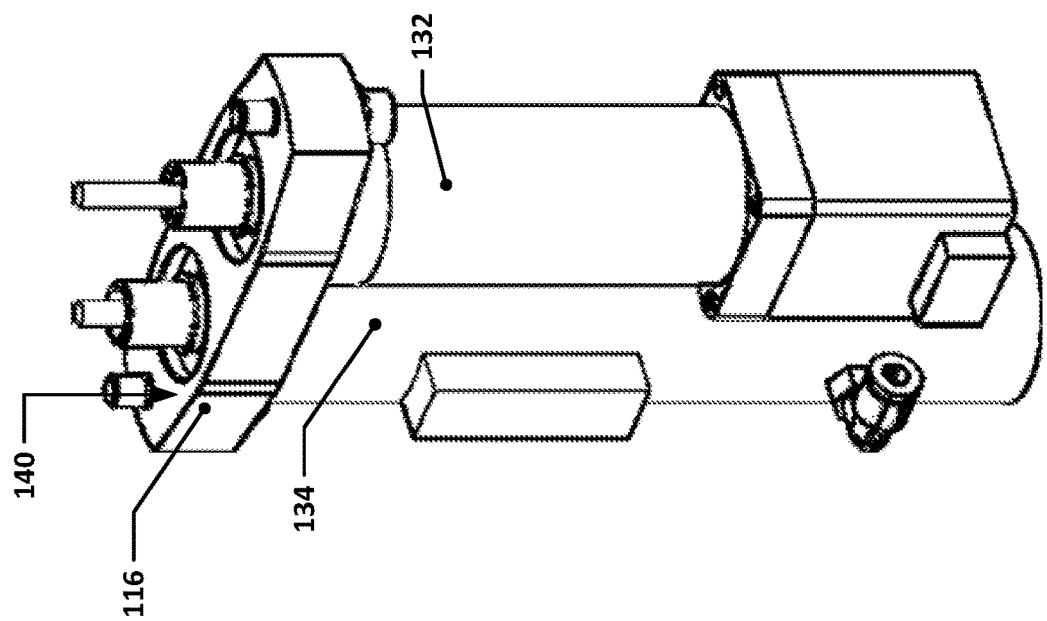
Figures 1, 2:
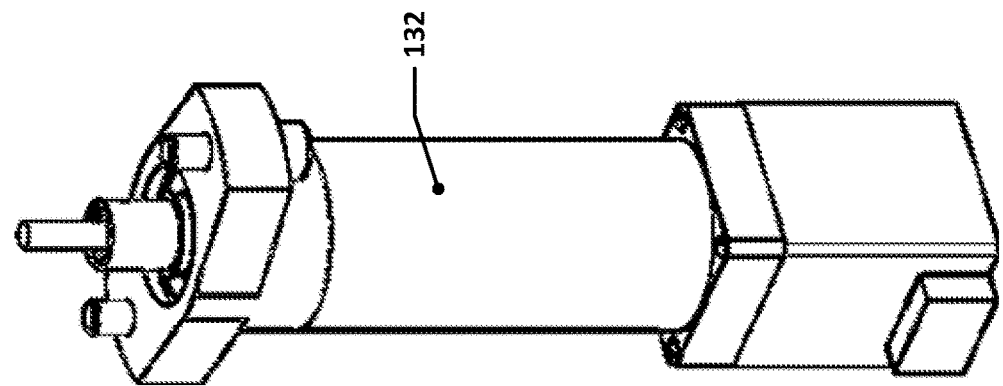
Figure 1:
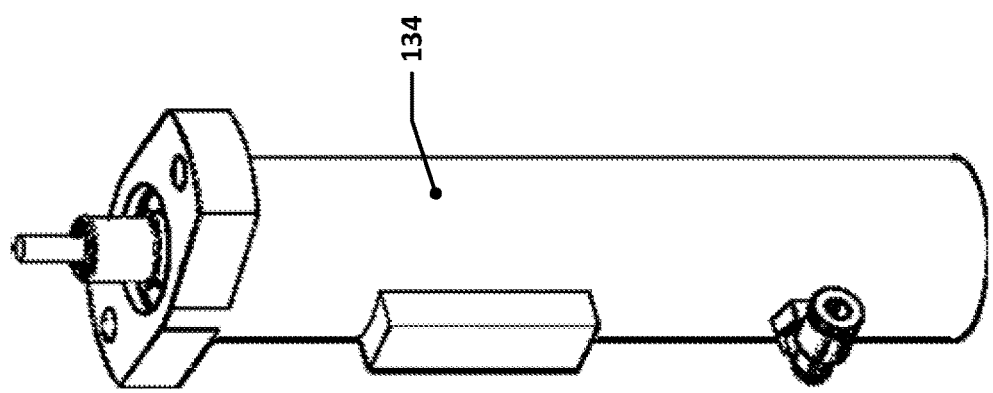
FIG. 1-1 depicts an example pneumatic lifter structure actuator.
Figures 1, 2:
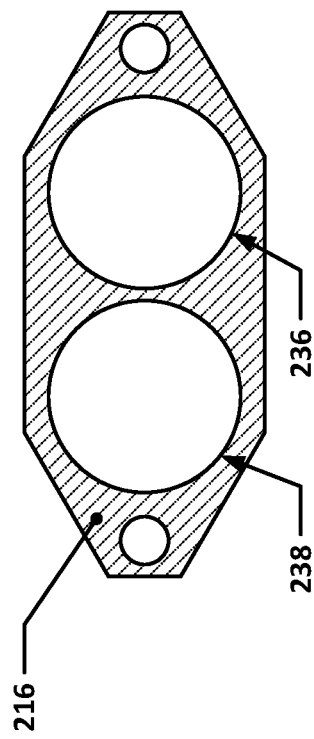
Figure 2:
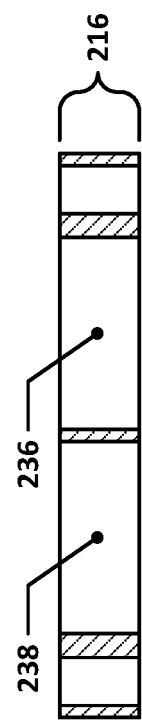
Figure 3:
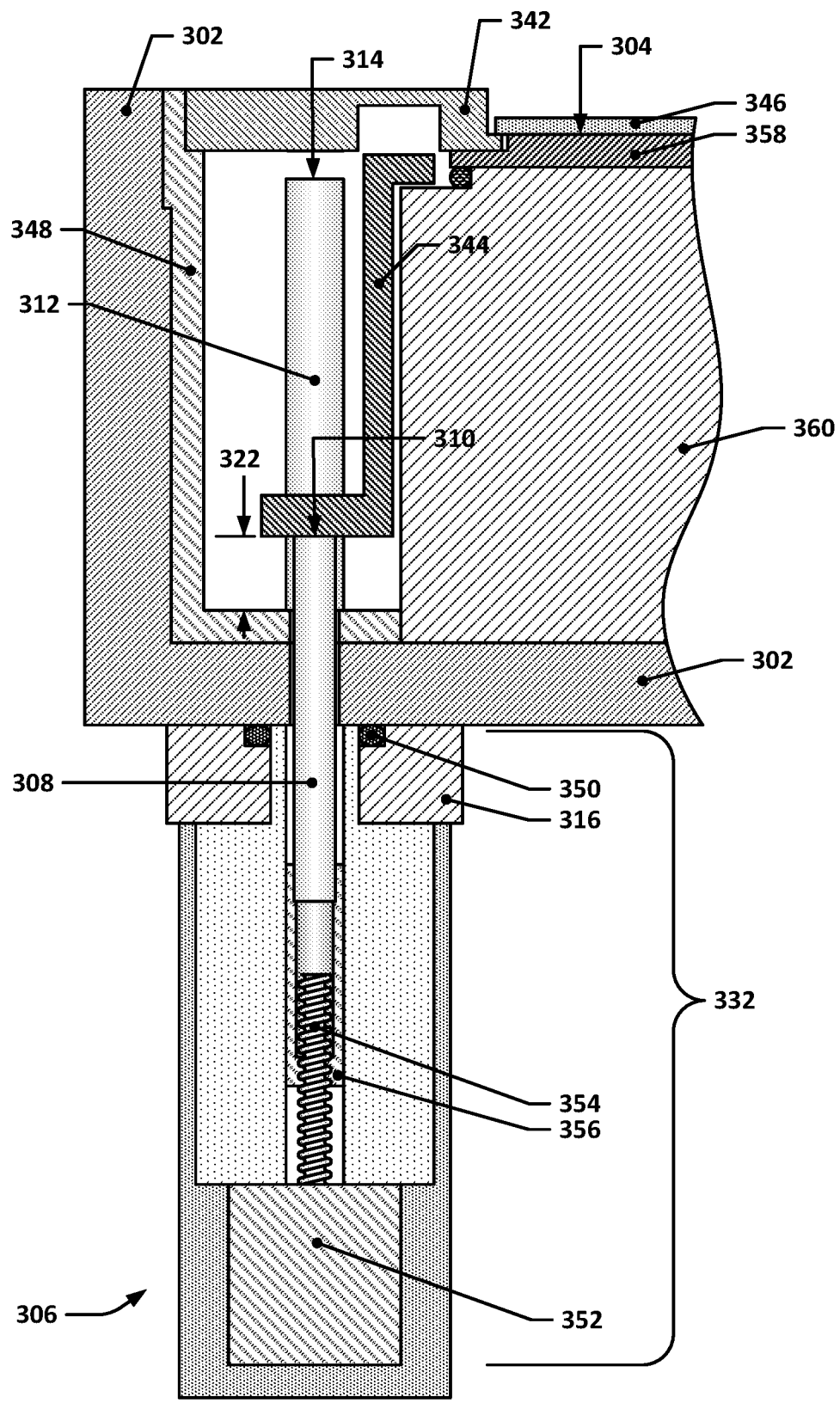

FIG. 1-1 depicts an example pneumatic lifter structure actuator. As can be seen, the example pneumatic lifter structure actuator 134 has an interface at the top that includes a two-hole/fastener mounting flange, an annular O-ring gland/groove, and a tubular receiver for receiving a shaft, such as a lifter structure, that may be inserted therein so as to mate with a piston or plunger within the pneumatic lifter structure actuator. Pressurized gas, e.g., air, may be introduced into the pneumatic actuator via a pneumatic inlet FIG. 1-2 depicts an example electromechanical lifter structure actuator. The electromechanical lifter structure actuator 132 may, as with the pneumatic lifter structure actuator 134, have an interface at the top that includes a two-hole/fastener mounting flange, an annular O-ring gland/groove, and a tubular receiver for receiving a shaft, such as a lifter structure, that may be inserted therein so as to mate with a piston or plunger within the electromechanical lifter structure actuator. The electromechanical lifter structure actuator 132 may also include a motor 152 that may be actuated so as to cause the lifter structure that may be mounted within the tubular receiver to extend or retract.

FIG. 1-3 depicts an example dual-lift mechanism featuring a common flange structure, a pneumatic lifter structure actuator, and an electromechanical lifter structure actuator. As can be seen in FIG. 1-3, a common flange structure 116 may be provided that has two interfaces, e.g., apertures, for receiving actuators for lifter structures. In the depicted example, a pneumatic lifter structure actuator 134 is mated to one of the apertures in the common flange structure 116, and an electromechanical lifter structure actuator 132 is mated to the other of the apertures in the common flange structure 116. The common flange structure 116 may have a first side 140 that is configured to be mated against a surface of a semiconductor processing chamber, as well as two (or more) through-holes for receiving fasteners (in FIG. 1-3, fasteners are shown inserted through such holes) that may be threaded into threaded holes in the semiconductor processing chamber structure and used to clamp the common flange structure 116 against the surface of the semiconductor processing chamber. O-rings may be placed in the annular grooves formed between the common flange structure 116 and the tubular receivers of the electromechanical lifter structure actuator 132 and the pneumatic lifter structure actuator 134 in order to provide a gas-tight seal.

FIGS. 2-1 and 2-2 depict, respectively, top and side section views of a common flange structure. As shown in FIGS. 2-1 and 2-2, a common flange structure 216 may include a first aperture 236 and a second aperture 238; the first aperture 236 may be used to receive and mount a first actuator (e.g., for lifter structures used to adjust the height of a lower edge ring) and the second aperture 238 may be used to receive and mount a second actuator (e.g., for lifter structures used to adjust the height of an upper edge ring). The apertures, in this example, are simple through-holes, but may take other forms depending on how the actuators are to be mounted. In this case, the actuators may be lightly press-fit within the apertures 236 and 238. In some instances, locking features, e.g., transversely inserted pins that may engage with features on both the exteriors of the actuators and the common flange structure, may be used to provide additional securement of the actuators within the common flange structure 216.

FIG. 3 is a cross-sectional diagram of a portion of an example semiconductor processing chamber with a dual-lift mechanism. FIG. 3 (as well as FIGS. 4 through 6) show a section view along a direction that is perpendicular to a center axis of a wafer 346 that may be processed within the semiconductor processing chamber 302. The wafer 346 may be supported within the semiconductor processing chamber 302 by a wafer support 360, e.g., a wafer chuck or pedestal, which may have a top plate 358 that provides a wafer support surface 304. In some implementations, the wafer support surface 304 may be instead provided by the wafer support 360 directly. The semiconductor processing chamber 302 may optionally include a liner 348 that may help protect the interior walls of the semiconductor processing chamber 302 from exposure to processing gases and other potentially deleterious conditions.

As shown in FIG. 3, the semiconductor processing chamber 302 may also include an upper edge ring 342 and a lower edge ring 344; the lower edge ring 344 may have an upper portion that may, in some instances, be receivable in an annular groove on the underside of the upper edge ring 342 when the lower edge ring 344 is moved upwards by a sufficient amount.

Figure 5:
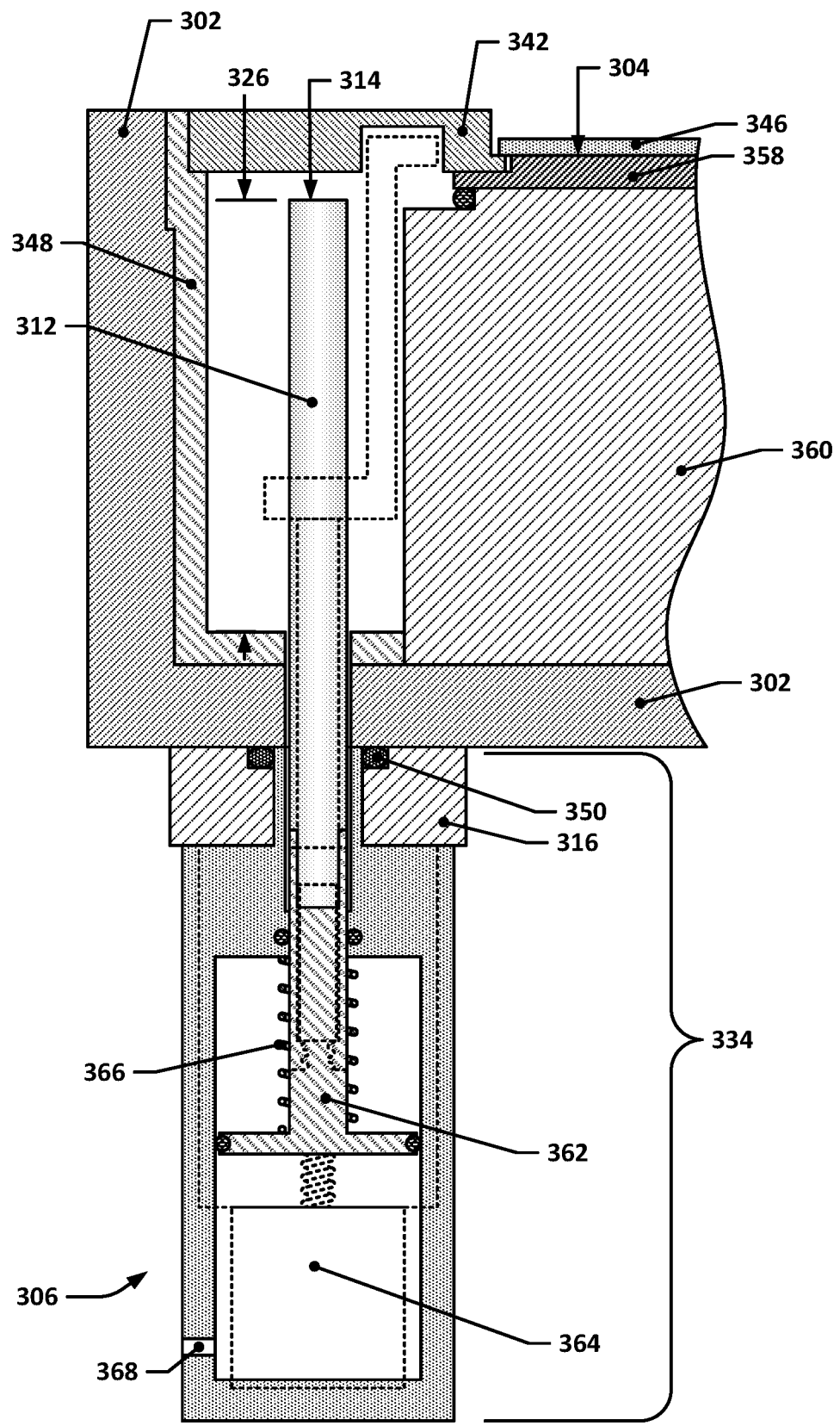
FIG. 5 is a further cross-sectional diagram of the portion of the example semiconductor processing chamber of FIG. 3.

The semiconductor processing chamber 302 may also include one or more (in this case, three), dual-lift mechanisms 306, each of which may include a common flange structure 316 that houses an electromechanical actuator 332 and a pneumatic actuator 334 (not called out in FIG. 3, but see FIG. 5). The electromechanical actuator 332 and the pneumatic actuator 334 may be sealed against the semiconductor processing chamber 302 using seals 350

The electromechanical actuator 332 may be connected with a first lifter structure 308, and the pneumatic actuator 334 may be connected with a second lifter structure 312. The electromechanical actuator 332, in this example, is a lead screw actuator and has a motor 352, a lead screw 354, and a lead screw nut 356. The lead screw nut 356 may engage with the lead screw 354 and with other portions of the electromechanical actuator 332 such that when the lead screw 354 is rotated, e.g., through actuation of the motor 352, the lead screw nut 356 is caused to translate along a first axis, e.g., an axis generally parallel to the center axis of the wafer 346. It will be understood that other types of screw-driven actuator may be used as well, including ball screws, for the screw-driven actuators discussed herein.

The first lifter structure 308 may have a first contact surface 310 that may be caused to contact the underside of the lower edge ring 344 and to support the lower edge ring 344 during translation of the lower edge ring 344. The first lifter structure 308 may be translatable from a first elevation 322 to one or more other elevations through actuation of the electromechanical actuator 332.

The second lifter structure 312 may have a second contact surface 314 that may be caused to contact the underside of the upper edge ring 342 and to lift the upper edge ring 342 upwards, off of the wafer support 360, top plate 358, liner 348, or whatever structure may be supporting the upper edge ring 342.

Figure 4:
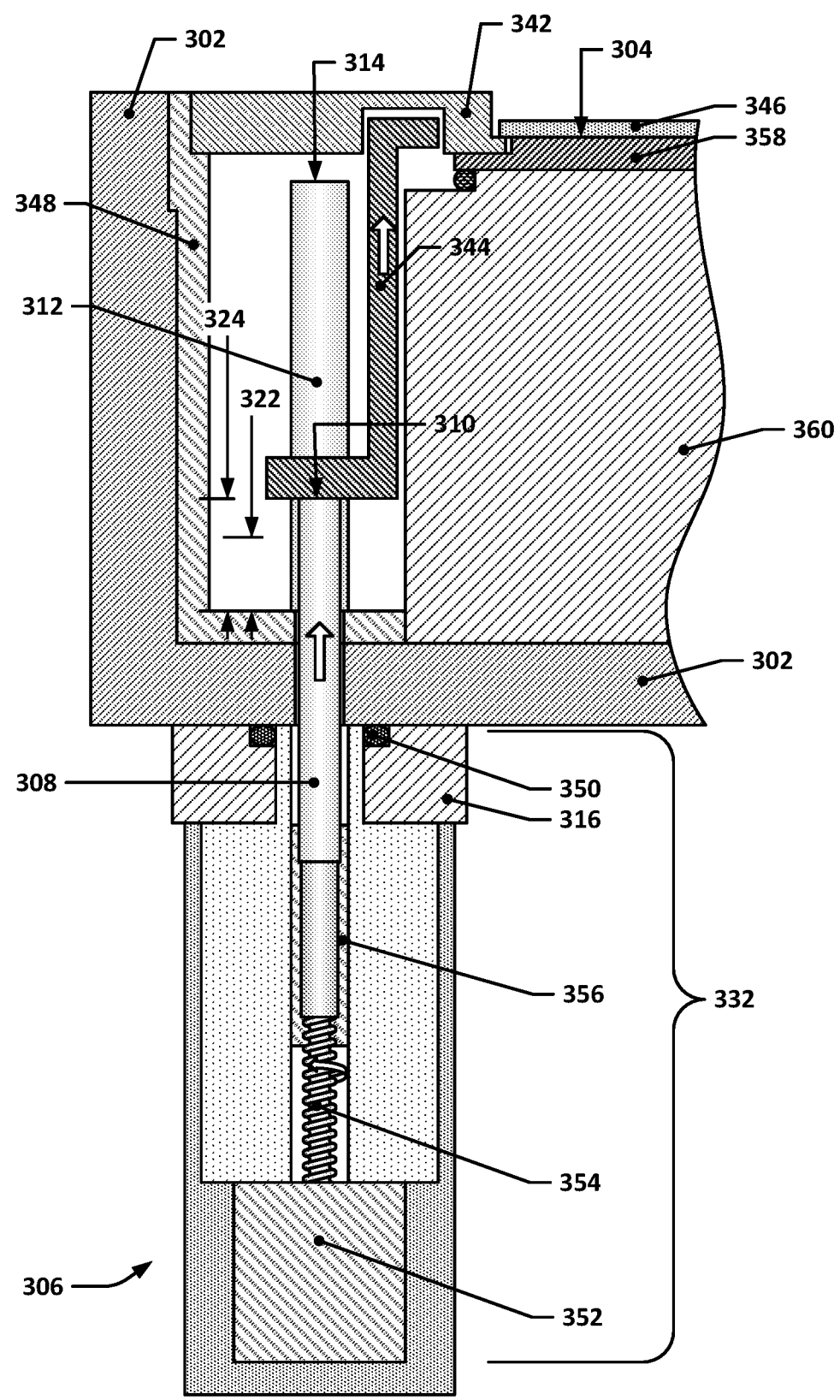
FIG. 4 is another cross-sectional diagram of the portion of the example semiconductor processing chamber of FIG. 3.

FIG. 4 is another cross-sectional diagram of the portion of the example semiconductor processing chamber of FIG. 3. In FIG. 4, the motor 352 has been actuated to cause the lead screw 354 to rotate, causing the lead screw nut 356 and the first lifter structure 308 to translate upwards, causing the first contact surface 310 to move to a second elevation 324. As can be seen, this causes the lower edge ring 344 to move upwards so that a portion of the lower edge ring 344 is received in an annular groove in the underside of the upper edge ring 342. It will be appreciated that the motor 352 may be controlled so as to cause the lead screw 354 to rotate by as much or as little as desired, so as to allow the lower edge ring 344 to be moved upward or downward by very small increments to allow for fine tuning of the vertical position of the lower edge ring 344 to any desired position.

FIG. 5 is a further cross-sectional diagram of the portion of the example semiconductor processing chamber of FIG. 3. In FIG. 5, the first actuator 332, first lifter structure 308, and lower edge ring 344 have been rendered with dotted outlines but are not otherwise shown. The cross-sectioning plane is also somewhat different from that used in FIGS. 3 and 4, passing through the center of the pneumatic actuator 334 instead of the electromechanical actuator 332. As can be seen, the pneumatic actuator 334 may include a piston 362 that passes through a body of the pneumatic actuator 334 and includes a disk-like structure that extends across a plenum 364 so that when pressurized gas is introduced into the plenum 364 via a pneumatic inlet 368, the pressurized gas may force the piston 362 upwards, thereby causing the second lifter structure 312 to translate upwards as well. When the pressurized gas is removed, e.g., vented, a spring 366 may cause the piston 362, and the second lifter structure 312, to translate downwards again.

Figure 6:
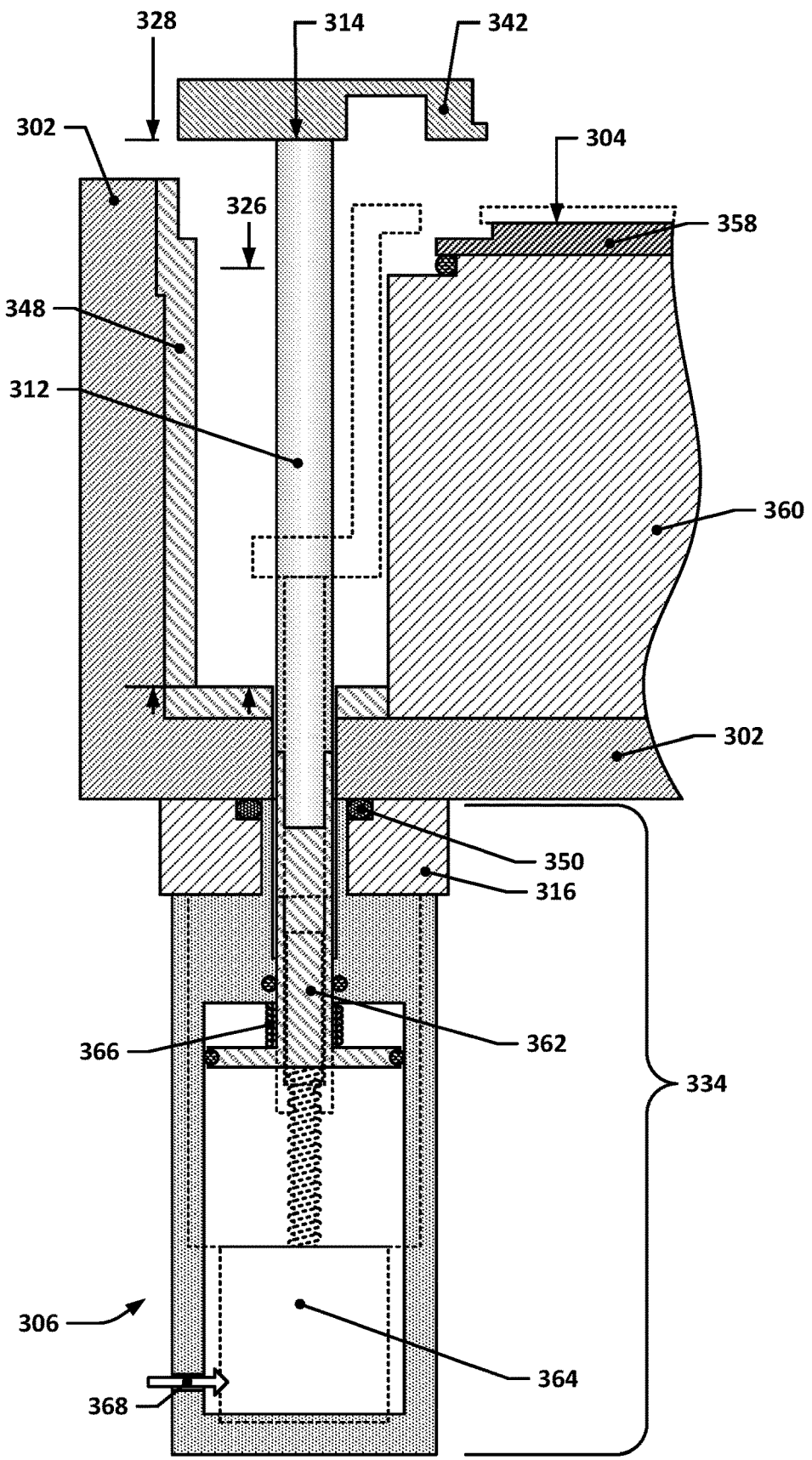
FIG. 6 is also a cross-sectional diagram of the portion of the example semiconductor processing chamber of FIG. 3.

In the depicted configuration, the second lifter structure 312 is at a position in which the second contact surface 314 is at a third elevation 326. When the pneumatic actuator 334 is pressurized with gas via the pneumatic inlet 368, the second lifter structure 312 may translate upwards, causing the second contact surface to move from the third elevation 326 to a fourth elevation 328, as shown in FIG. 6. This causes the second contact surface 314 to lift the upper edge ring 342 clear of the wafer support 360, top plate 358, liner 348, or any other structure that may be supporting the upper edge ring 342.

It will be noted that the electromechanical actuator 332 and the pneumatic actuator 334 may be operated independently, allowing the first lifter structure 308 and the second lifter structure 312 to be operated independently, i.e., without causing any movement of the other. In other implementations, there may be some interplay between the actuation of the first lifter structure 308 and the second lifter structure 312 that causes them to move in unison for some portion of the translation of the second lifter structure, although in such cases, there will also be at least some portion of the translation of the second lifter structures in which the first lifter structures will not translate.

Figure 7:
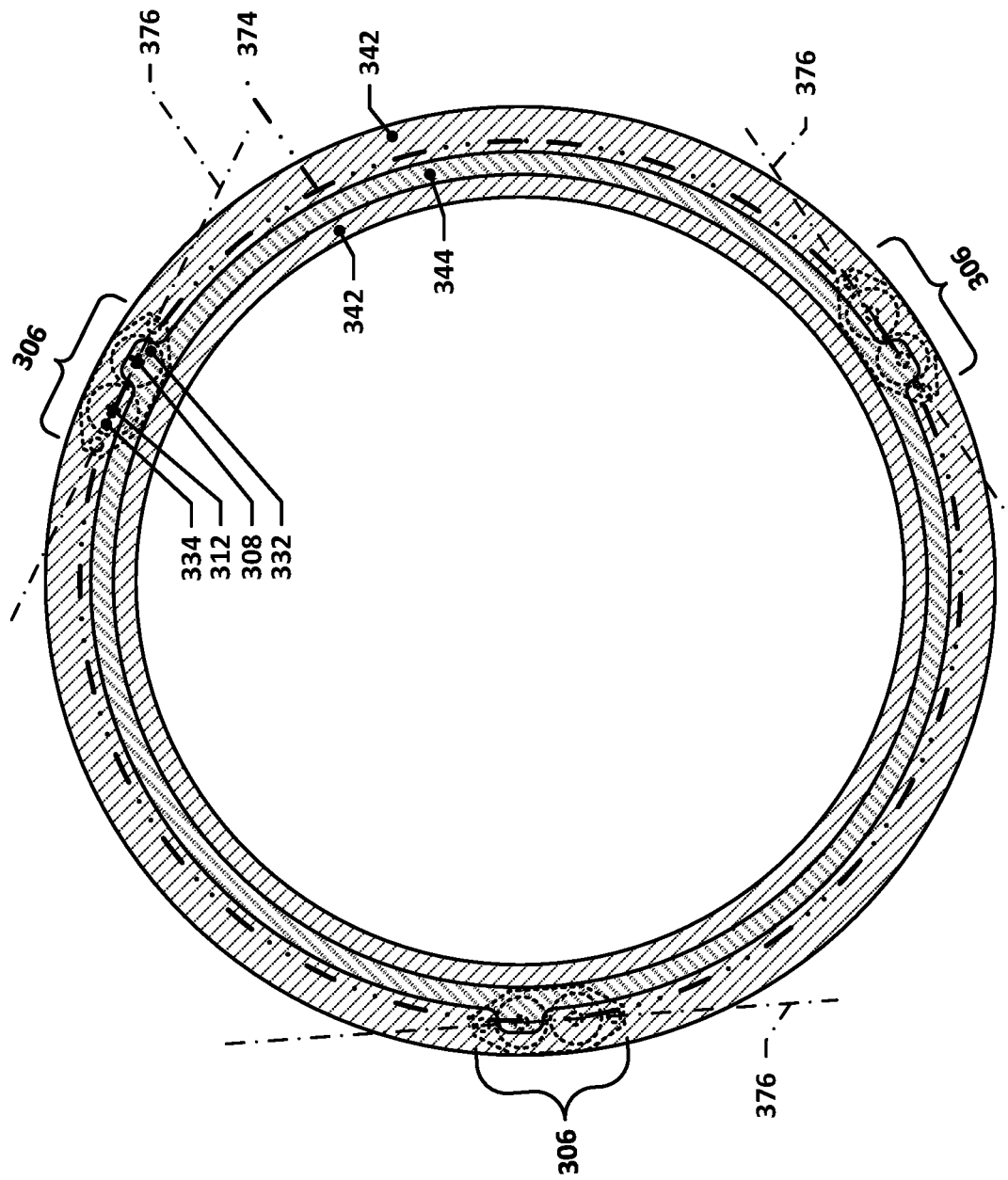
FIG. 7 is a top view of an example upper edge ring, lower edge ring, and dual-lift mechanisms.

FIG. 7 is a top view of an example upper edge ring, lower edge ring, and dual-lift mechanisms. As can be seen, the lower edge ring 344 is concentric with and overlapped from above by the upper edge ring 342. Moreover, three dual-lift mechanisms 306 can be seen to be arranged at locations spaced 120° apart about a circle 374 centered on the edge rings/wafer support surface/wafer. It will be appreciated that other circumferential positioning of such dual-lift mechanisms 306 may be used as well, e.g., non-equidistantly spaced dual-lift mechanisms. As can be seen, the dual-lift mechanisms 306 may be arranged such that the first lifter structures 308 and the second lifter structures 312 may all lie within an annular area that is concentric with the circle 374 and has an annular radial width that is smaller than a diameter of the smallest circle that circumscribes, i.e., touches, the first lifter structure and the second lifter structure of one of the dual-lift mechanisms 306. In other words, the dual-lift mechanisms 306 may be arranged such that a line passing through the centerlines of the first lifter structure 308 and the second lifter structure 312 of a given one of the dual-lift mechanisms 306 does not pass through the center of the circle 374. This allows the dual-lift mechanisms to be arranged so as to take up less radial space, allowing for tighter packaging and a reduced volume for the semiconductor processing chamber. In a more extreme case, as shown in FIG. 7, a plane passing through both the first lifter structure and the second lifter structure of a given dual-lift mechanism 306 may be parallel to a reference plane that is tangent to the circle 374 and parallel to the first axis (or center axis). In an even more extreme case, a line or plane 376 passing through the centers of the first lifter structure and the second lifter structure of a given dual-lift mechanism 306 may be tangent to the circle, as shown in FIG. 7. In some such implementations, the lower edge ring 344 may have tabs, as shown, that may serve to contact the first contact surfaces 310 of the first lifter structures 308 while allowing the second lifter structures 312 to pass by the lower edge ring. In other implementations, the lower edge ring may simply have a flange that passes around its entire circumference to contact the first contact surfaces; such a flange may instead have through-holes or radial notches that allow the second lifter structures to pass therethrough.

It will be further appreciated that while pneumatic and electromechanical actuators are shown as being used herein in the dual-lift mechanisms, any suitable actuator(s) may be used to provide vertical translation of the first lifter structures and the second lifter structures. Accordingly, reference may simply be made to a first actuator for causing vertical translation of the first lifter structures, and a second actuator for causing vertical translation of the second lifter structure.

While the above discussion has focused on dual-lift mechanisms featuring separate actuators for each lifter structure included in such dual-lift mechanisms, some overlapping functionality may be provided using dual-lift mechanisms featuring single-actuator drive systems. Such single-actuator variants may provide less flexibility in terms of not being able to move each lifter structure completely independently from the other but may prove less expensive due to the reduced actuator requirements of such devices and the need for less controller capability for controlling such dual-lift mechanisms.

Figure 8:
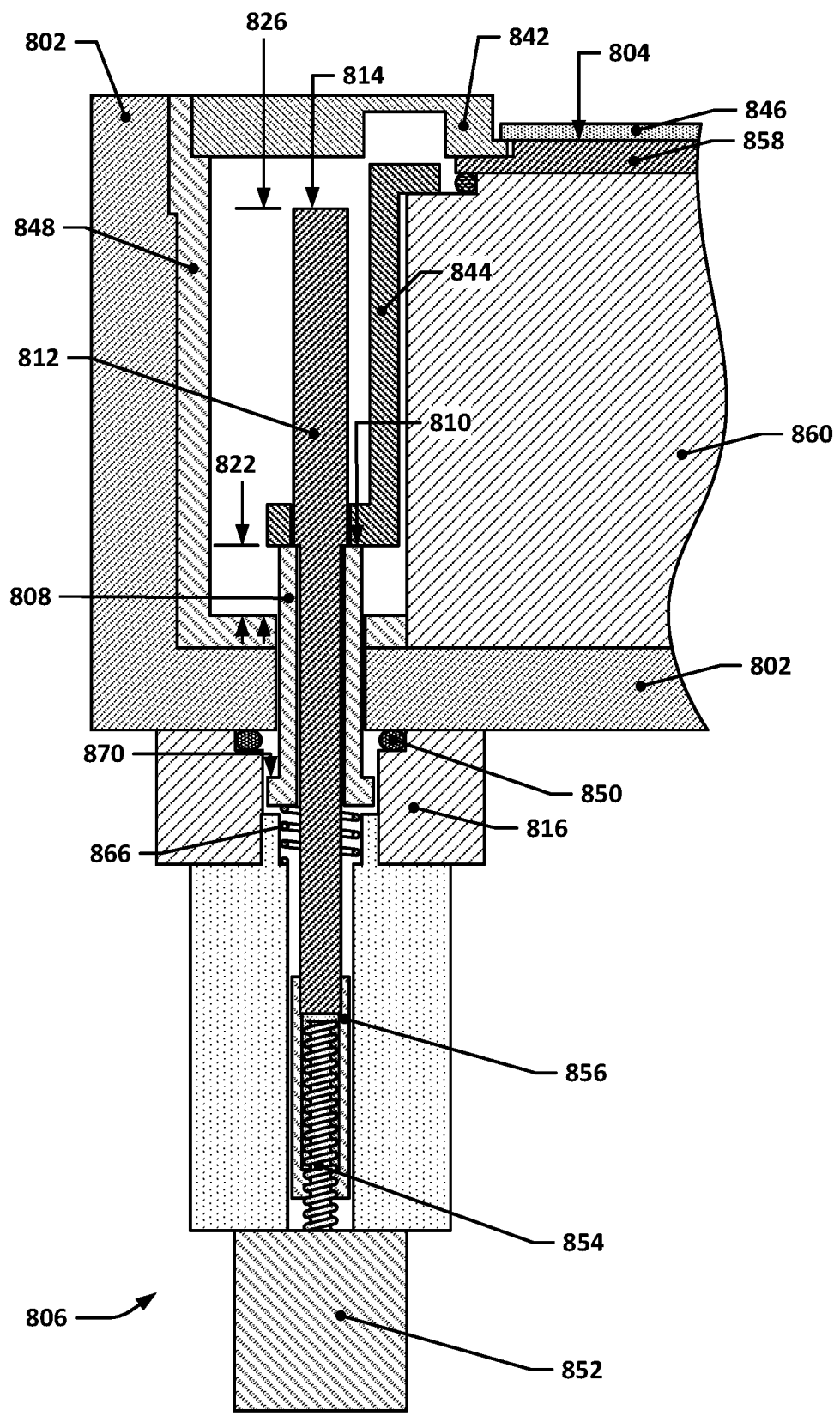
FIG. 8 is a cross-sectional diagram of a portion of another example semiconductor processing chamber with another example dual-lift mechanism.

FIG. 8 is a cross-sectional diagram of a portion of another example semiconductor processing chamber with another example dual-lift mechanism. FIG. 8 (as well as FIGS. 9 and 10) show a section view along a direction that is perpendicular to a center axis of a wafer 846 that may be processed within the semiconductor processing chamber 802. As with the similar processing chamber of FIGS. 3 through 6, the wafer 846 may be supported within the semiconductor processing chamber 802 by a wafer support 860, e.g., a wafer chuck or pedestal, which may have a top plate 858 that provides a wafer support surface 804 (as with the processing chamber of FIGS. 3 through 6, the top plate 858 may be optional, and the wafer support surface 804 may be provided by the wafer support 860 directly). The semiconductor processing chamber 802 may optionally include a liner 848 that may help protect the interior walls of the semiconductor processing chamber 802 from exposure to processing gases and other potentially deleterious conditions.

The semiconductor processing chamber 802 may also include an upper edge ring 842 and a lower edge ring 844 that are similar in purpose and design to the upper edge ring 342 and the lower edge ring 344 discussed earlier. The lower edge ring 844 may be moved up and down relative to the wafer support 860 and the upper edge ring 842 to fine-tune the degree of capacitive coupling between the edge rings and the wafer support 860. The upper edge ring 842 may act to protect the edge of the wafer 846 and the lower edge ring 844 from undesirable etching or deposition during semiconductor processing operations performed in the semiconductor processing chamber 802. As with the upper edge ring 342, the upper edge ring 842 may be periodically lifted clear of the wafer support 860 to allow for an end effector of a wafer/edge ring handling robot to be inserted between the upper edge ring 842 and the wafer support 860 in order to allow the upper edge ring 842 to then be lowered onto the end effector and removed from the semiconductor processing chamber 802 for replacement with a new upper edge ring 842.

In FIG. 8, a dual-lift mechanism 806 is shown that includes a first lifter structure 808 and a second lifter structure 812. The first lifter structure 808, in this example, is a generally tubular component, e.g., a cylindrical sleeve, that extends through the wall of the semiconductor processing chamber 802 (and, if used and necessary, the liner 848), e.g., via an aperture through the wall of the semiconductor processing chamber 802. The second lifter structure 812, in contrast, is a much longer component, e.g., a rod, that extends through the first lifter structure 808. In this example, the first lifter structure 808 and the second lifter structure 812 are both axially symmetric, e.g., generally cylindrical in appearance, but it will be recognized that the first lifter structure 808 and/or the second lifter structure 812 may have non-circular cross-sectional shapes as well depending on the particular design used (this applies to the lifter structures discussed with respect to FIGS. 3 through 6 as well).

As is evident from FIG. 8, the second lifter structure 812 may be generally described as being coaxial with the first lifter structure 808. It will be understood that non-coaxial arrangements of the structures depicted in FIG. 8 may also be used to similar effect and are also considered within the scope of this disclosure. The dual-lift mechanism 806 may also include a spring 866 which may be configured to exert an upward force on the first lifter structure 808, thereby urging it upwards towards the upper edge ring 842. The spring 866, for example, may be supported at one end by one or more surfaces that are fixed with respect to a common flange structure 816 that is part of the dual-lift mechanism 806 and that is used to attach the dual-lift mechanism 806 to the semiconductor processing chamber 802. It will be understood that the common flange structure 816, in this case, may feature only a single through-hole for both lifter structures (as compared to the common flange structure 316, which provided separate through-holes for the two lifter structures). The common flange structure 816 may, as with the common flange structure 316, include a seal 850 that seals the common flange structure 816 to the outer surface of the semiconductor processing chamber 802. The other end of the spring 866 may, for example, butt up against the bottom surface of the first lifter structure 808. At the same time, the second lifter structure 812 may extend through the center of the spring 866, thereby keeping the spring 866 from potentially falling over, becoming cocked, or otherwise moving into an undesirable position. It will be appreciated that other springs, e.g., leaf springs, may be used in place of the depicted coil or compression spring 866.

As can be seen in FIG. 8, the second lifter structure 812 may have a first portion that has a diameter (or cross-sectional shape) that is larger than the interior diameter (or cross-sectional shape) of the first lifter structure 808 and a second portion that has a diameter (or cross-sectional shape) that is smaller than the interior diameter (or cross-sectional shape) of the first lifter structure 808. The second portion of the second lifter structure 812 may thus be able to be inserted through, and freely translated through, the first lifter structure 808, but the transition in size of the second lifter structure 812 between the first portion and the second portion of the second lifter structure may act to provide a stop surface 872 (see FIG. 10), e.g., an annular ledge, that prevents the first lifter structure 808 from being moved past the stop surface.

The lower edge ring may, for example, have openings or notches at locations about its perimeter that are sized to allow the second portions of the second lifter structures 812 to be passed therethrough without necessarily contacting the lower edge ring 844 but which are also sized or configured to not permit the first lifter structures 808 to not pass therethrough. For example, the lower edge ring 844 shown in FIG. 8 has two vertically spaced-apart, generally annular surfaces that are joined together by a cylindrical surface, e.g., a tubular structure with a flange extending radially inward from one end (the upper end) and another flange extending radially outward from the other end—the radially outward extending flange may, for example, have holes passing therethrough (as shown in FIG. 8) that are sized slightly larger than the second portions of the second lifter structures 812 and slightly smaller than the top-most surfaces of the first lifter structures 808.

The dual-lift mechanism 806 may be configured such that the spring 866 pushes the first lifter structure 808 into contact with the stop surface 872 of the second lifter structure 812 for at least some amount of the travel that the second lifter structure 812 may be able to be caused to move through. Thus, the spring 866 may act to cause the first lifter structure 808 and the second lifter structure 812 to move in unison for at least part of the travel of the second lifter structure 812.

For example, in the configuration shown in FIG. 8, the second lifter structure 812 has been moved, e.g., through actuation of a screw 854 by a motor 852 to drive a screw nut 856, to cause the first lifter structure 808 to rest against the underside of a portion of the lower edge ring 844. The portion of the first lifter structure 808 that contacts the underside of the lower edge ring 844 provides a first contact surface 810. The first contact surface 810 may, for example, be positioned at a first elevation 822. At the same time, a second contact surface 814 on the second lifter structure 812 may be positioned at a third elevation 826.

Figure 9:
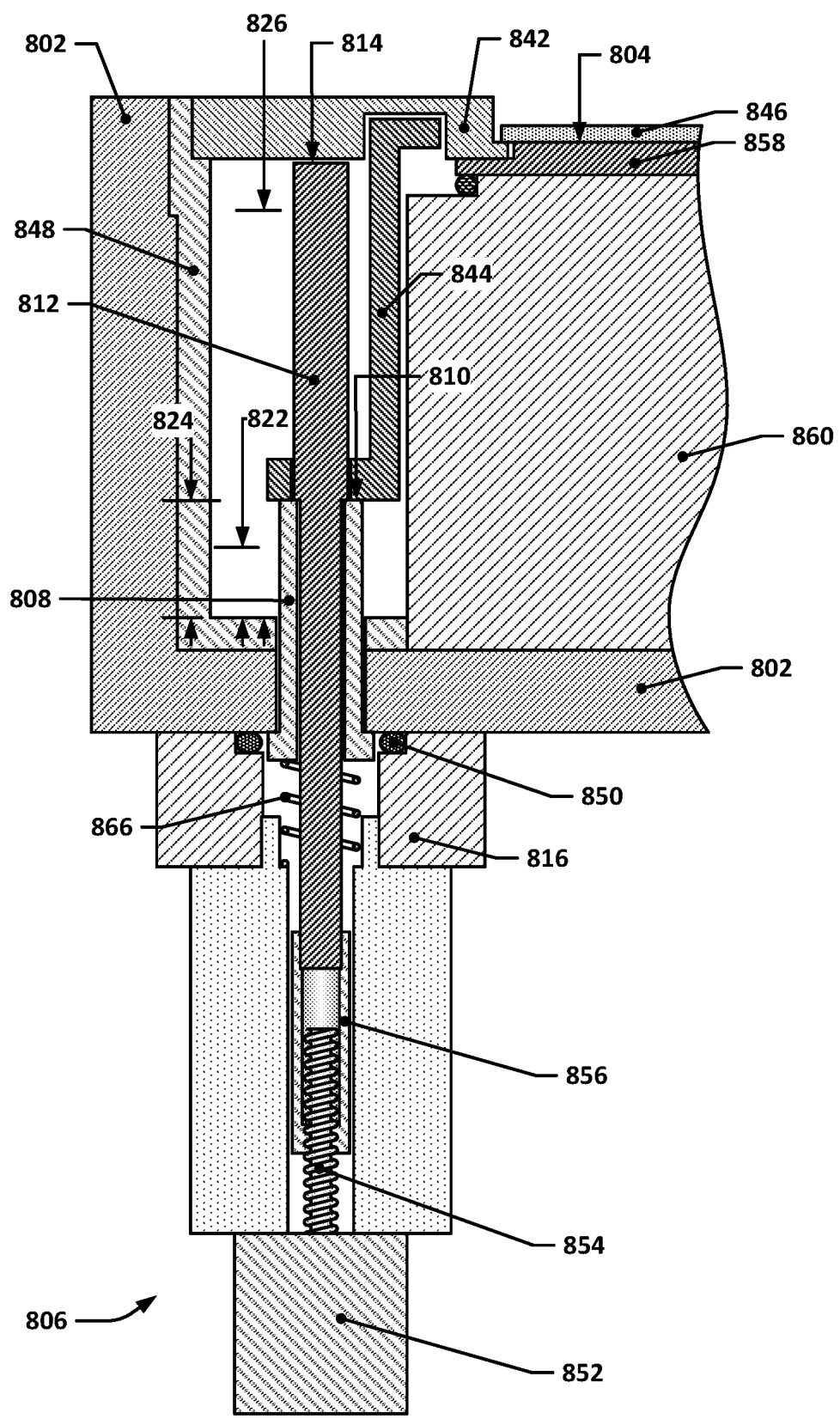
FIG. 9 is another cross-sectional diagram of the portion of the example semiconductor processing chamber of FIG. 8.

FIG. 9 is another cross-sectional diagram of the portion of the example semiconductor processing chamber of FIG. 8. In FIG. 8, the motor 852 has been actuated so as to cause the screw 854 to rotate and drive the screw nut 856 and the attached second lifter structure 812 upwards such that the first contact surface 810 of the first lifter structure 808 is driven upwards to a second elevation 824, thereby causing the lower edge ring 844 to move upwards by a corresponding amount as well. It will be appreciated that through moving the second lifter structure 812 to any intermediate position between the positions shown in FIGS. 8 and 9, the lower edge ring 844 may be caused to move to any corresponding position between the two positions shown in FIGS. 8 and 9. The spring 866 may be selected to have a spring force, and a compressive preload when the first lifter structure 808 is in at least the position shown in FIG. 8 (and throughout the range of positions that the first lifter structure 808 is to be in when adjusting the elevation of the lower edge ring 844), that is sufficient to support the load of the first lifter structure 808 and the lower edge ring 844 without overcoming the preload compression of the spring 866, i.e., such that no gap opens up between the first lifter structure 808 and the stop surface 872 of the second lifter structure 812 is such positions.

The dual-lift mechanism 806 may be further configured such that the first lifter structure 808 may stop moving at some point during the upward movement of the second lifter structure 812. For example, in some implementations, the first lifter structure 808 may be moved sufficiently upward that the spring 866 is no longer actively compressed by a downward force exerted on the first lifter structure 808 by the stop surface 872 of the second lifter structure 812, at which point the first lifter structure 808 may stop moving with the second lifter structure 812. In other implementations, such as that shown in FIGS. 8 through 10, the first lifter structure 808 may also have a stop surface 870 (see FIG. 8), e.g., such as the annular flange shown in FIGS. 8 through 10, that may engage with one or more surfaces that are fixed with respect to the common flange structure 816 to prevent the first lifter structure 808 from moving beyond, for example, a position where the first contact surface 810 of the first lifter structure 808 is at the second elevation 824. Thus, further vertical translation of the second lifter structure 812 may be performed without attendant vertical translation of the first lifter structure 808.

Figure 10:
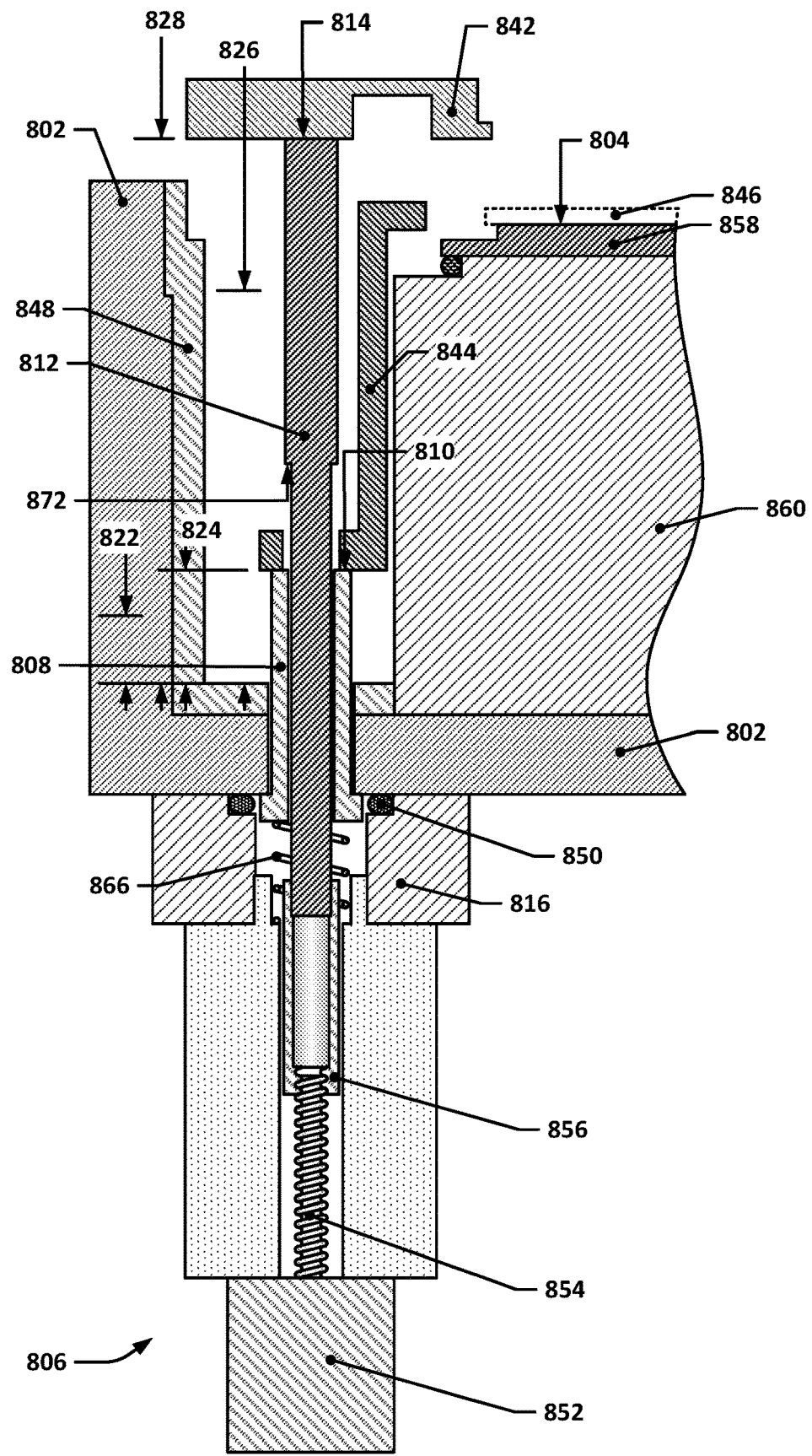
FIG. 10 is yet another cross-sectional diagram of the portion of the example semiconductor processing chamber of FIG. 8.

FIG. 10 is yet another cross-sectional diagram of the portion of the example semiconductor processing chamber of FIG. 8; FIG. 10 shows such further upward translation of the second lifter structure 812 without attendant upward translation of the first lifter structure 808. As shown in FIG. 10, the second contact surface 814 of the second lifter structure 812 may eventually contact the underside of the upper edge ring 842 when the second lifter structure 812 is moved far enough upward. Further upward movement of the second lifter structure 812 may thus cause the upper edge ring 842 to be pushed upwards, off of the wafer support 860 and/or the top plate 858. The second lifter structure 812 may be driven upward, for example, until the second contact surface 814 is at a fourth elevation 828, thereby elevating the upper edge ring 842 sufficiently high enough above the wafer support 860 and/or top plate 858 that an end effector can be inserted beneath the upper edge ring 842.

As can be seen, dual-lift mechanisms such as the dual-lift mechanism 806 allow for a compact mechanism that can be used to perform limited-travel, fine-tuning adjustment of the lower edge ring 844 for part of its actuation stroke while providing for larger-travel movement of the upper edge ring 842 for another part of its actuation stroke.

Figure 11:
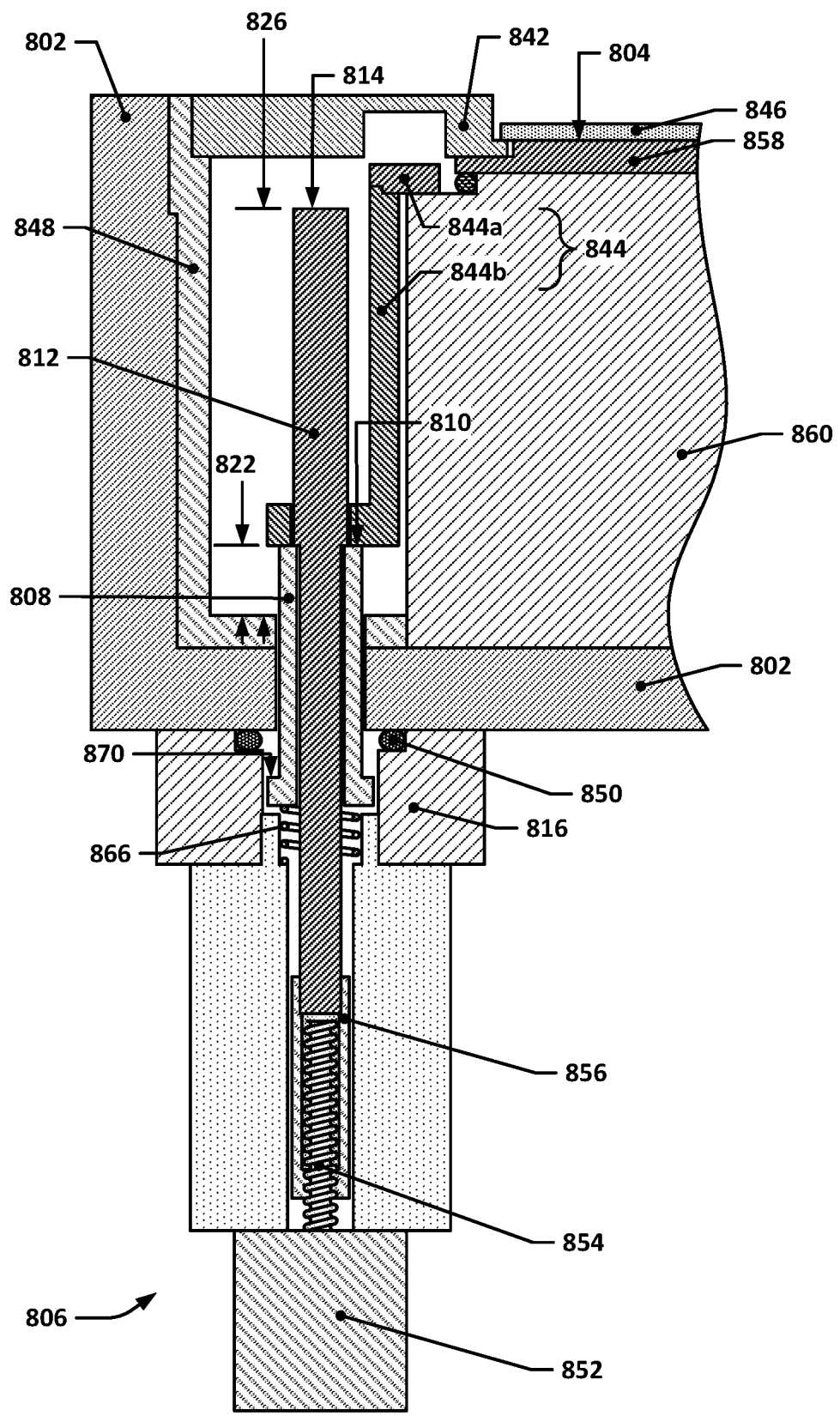
FIG. 11 is a cross-sectional diagram of the example semiconductor processing chamber of FIG. 8 with a variant of the example dual-lift mechanism depicted.

It will be understood that while the lower edge ring shown in the previous Figures has generally been of a unitary (single-piece) design, other implementations of the concepts discussed herein may utilize a lower edge ring that includes multiple components. FIG. 11 is a cross-sectional diagram of the example semiconductor processing chamber of FIG. 8 with a variant of the example dual-lift mechanism depicted that uses a multi-component lower edge ring.

In FIG. 11, the edge ring 844 of previous Figures has been replaced with a two-part edge ring having an upper portion 844a and a lower portion 844b. The upper portion 844a, in this case, is in the shape of a generally flat, annular ring, and rests atop the lower portion 844b, which, in this example, has a generally tubular shape with a flange or radial protrusions extending radially outward from the bottom edge so as to provide a surface for the first contact surface 810 to butt up against. Such an arrangement may allow the upper portion 844a to be replaced independently of the lower portion 844b, thereby allowing, for example, a worn-out upper portion 844a to be replaced with a newer portion 844a without having to replace the lower portion 844b, which may be more expensive to manufacture given its larger size and more complex geometry. Moreover, different configurations of the upper portion 844a may be used with the same lower portion 844b, e.g., upper portions 844 with different cross-sectional shapes, dimensions, and/or materials. It will be understood that reference to edge rings in this disclosure and in the claims may be inclusive of both single-piece edge rings and multi-piece edge rings and that in the case of the latter, multi-piece edge rings may include some components that may actually have little or no influence on wafer processing uniformity directly and may, for example, act solely to transfer upward or downward motion of the lifter structures to the upper portions of such edge rings.

The dual-lift mechanisms described herein may be controlled by a controller that may be part of a system that may include the above-described examples, and may be operatively connected with various valves, mass flow controllers, pumps, etc. so as to be able to receive information from and/or control such equipment. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of various gases, temperature settings (e.g., heating and/or cooling), pressure settings, vacuum settings, power settings, flow rate settings, fluid delivery settings, and positional and operation settings.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

It is to be understood that the phrases "for each <item> of the one or more <items>," "each <item> of the one or more <items>," or the like, if used herein, are inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items. Similarly, the term "set" or "subset" should not be viewed, in itself, as necessarily encompassing a plurality of items—it will be understood that a set or a subset can encompass only one member or multiple members (unless the context indicates otherwise).

The use, if any, of ordinal indicators, e.g., (a), (b), (c) . . . or the like, in this disclosure and claims is to be understood as not conveying any particular order or sequence, except to the extent that such an order or sequence is explicitly indicated. For example, if there are three steps labeled (i), (ii), and (iii), it is to be understood that these steps may be performed in any order (or even concurrently, if not otherwise contraindicated) unless indicated otherwise. For example, if step (ii) involves the handling of an element that is created in step (i), then step (ii) may be viewed as happening at some point after step (i). Similarly, if step (i) involves the handling of an element that is created in step (ii), the reverse is to be understood.

Terms such as "about," "approximately," "substantially," "nominal," or the like, when used in reference to quantities or similar quantifiable properties, are to be understood to be inclusive of values within ±10% of the values or relationship specified (as well as inclusive of the actual values or relationship specified), unless otherwise indicated.

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

It is to be further understood that the above disclosure, while focusing on a particular example implementation or implementations, is not limited to only the discussed example, but may also apply to similar variants and mechanisms as well, and such similar variants and mechanisms are also considered to be within the scope of this disclosure.

What is claimed is:

1. An apparatus comprising:
    a semiconductor processing chamber;
    a wafer support surface located within the semiconductor processing chamber and having an outer perimeter; and
    one or more dual-lift mechanisms, each dual-lift mechanism including:
        a first lifter structure having a first contact surface,
        a second lifter structure having a second contact surface,
        a common flange structure, and
        one or more actuators, wherein:
            the one or more actuators of each dual-lift mechanism are each mounted to the common flange structure of that dual-lift mechanism; and
            each dual-lift mechanism is positioned such that the first lifter structure and the second lifter structure thereof are positioned outside of the outer perimeter; and
    a controller configured to control the one or more actuators of each dual-lift mechanism to:
        cause the first lifter structure of that dual-lift mechanism to translate along a first axis perpendicular to the wafer support surface such that the first contact surface of that first lifter structure is moved between a first elevation and a second elevation,
        cause the second lifter structure of that dual-lift mechanism to translate along the first axis such that the second contact surface of that second lifter structure is moved between a third elevation and a fourth elevation, and
        cause the second lifter structure of that dual-lift mechanism to be translated at least partially along the first axis without simultaneous translation of the first lifter structure of that dual-lift mechanism along the first axis.

2. The apparatus of claim 1, further including an upper edge ring and a lower edge ring, wherein:
    the upper edge ring, when viewed along the first axis, overlaps the lower edge ring,
    the upper edge ring is concentric with the lower edge ring,
    the upper edge ring has an inner diameter larger than an outer diameter of the wafer support surface,
    the first contact surface of the first lifter structure of each dual-lift mechanism is in contact with the lower edge ring when that dual-lift mechanism is actuated to cause the first contact surface thereof to be at the first elevation, and
    the second contact surface of the second lifter structure of each dual-lift mechanism is in contact with the upper edge ring when that dual-lift mechanism is actuated to cause the second contact surface thereof to be at the fourth elevation.

3. The apparatus of claim 1, wherein a first distance between the first elevation and the second elevation is smaller than a second distance between the third elevation and the fourth elevation.

4. The apparatus of claim 1, wherein each dual-lift mechanism is connected to the semiconductor processing chamber by the common flange structure thereof.

5. The apparatus of claim 1, wherein, for each dual-lift mechanism:
    the one or more actuators of that dual-lift mechanism include a first actuator and a second actuator,
    the first actuator of that dual-lift mechanism is configured to translate the first lifter structure along the first axis when actuated,
    the second actuator of that dual-lift mechanism is configured to translate the second lifter structure along the first axis when actuated,
    the common flange structure of that dual-lift mechanism has a first side with a first aperture extending therethrough and a second aperture extending therethrough, the first side of the common flange structure of that dual-lift mechanism is mated against a portion of the semiconductor processing chamber, the first actuator of that dual-lift mechanism is positioned within the first aperture of the common flange structure of that dual-lift mechanism, and the second actuator of that dual-lift mechanism is positioned within the second aperture of the common flange structure of that dual-lift mechanism.

6. The apparatus of claim 5, wherein, for each dual-lift mechanism:

the first actuator of that dual-lift mechanism is an electromechanical actuator, and the second actuator of that dual-lift mechanism is a pneumatic actuator.

7. The apparatus of claim 5, wherein, for each dual-lift mechanism, the first actuator of that dual-lift mechanism is a screw actuator driven by an electric motor.

8. The apparatus of claim 5, wherein there are three dual-lift mechanisms arranged along a circle encircling the wafer support surface.

9. The apparatus of claim 8, wherein each dual-lift mechanism is oriented such that the first lifter structure of that dual-lift mechanism and the second lifter structure of that dual-lift mechanism both lie within an annular area that is concentric with the circle and that has an annular radial width that is smaller than a diameter of a smallest circle that circumscribes the first lifter structure of that dual-lift mechanism and the second lifter structure of that dual-lift mechanism.

10. The apparatus of claim 8, wherein each dual-lift mechanism is oriented such that a first reference plane passing through the first lifter structure of that dual-lift mechanism and the second lifter structure of that dual-lift mechanism is parallel to a second reference plane that is tangent to the circle and parallel to the first axis.

11. The apparatus of claim 1, wherein, for each dual-lift mechanism, the first lifter structure and the second lifter structure of that dual-lift mechanism are coaxial with each other.

12. The apparatus of claim 11, wherein, for each dual-lift mechanism:

the first lifter structure of that dual-lift mechanism has a hole extending therethrough along the first axis, and the second lifter structure of that dual-lift mechanism passes through the hole in the first lifter structure of that dual-lift mechanism.

13. The apparatus of claim 12, wherein each dual-lift mechanism includes a spring and, for each dual-lift mechanism:

the spring of that dual-lift mechanism is configured to exert a force on the first lifter structure of that dual-lift mechanism for at least some portion of the distance traversed by the first lifter structure of that dual-lift mechanism when translated such that the first contact surface of that first lifter structure is moved from the first elevation to the second elevation, and the force exerted by the spring of that dual-lift mechanism urges the first lifter structure of that dual-lift mechanism towards the second elevation.

14. The apparatus of claim 13, wherein, for each dual-lift mechanism, the spring of that dual-lift mechanism is configured to exert the force on the first lifter structure of that dual-lift mechanism for all of the distance traversed by the first lifter structure of that dual-lift mechanism when translated such that the first contact surface of that first lifter structure is moved from the first elevation to the second elevation.

15. The apparatus of claim 12, wherein the second lifter structure of each dual-lift mechanism includes a stop surface that is sized to prevent the first lifter structure of that dual-lift mechanism from moving past a first position relative to the second lifter structure of that dual-lift mechanism.

16. The apparatus of claim 12, wherein the first lifter structure of each dual-lift mechanism includes a stop surface that is sized to prevent the first lifter structure of that dual-lift mechanism from moving past a first position relative to the common flange structure.

17. The apparatus of claim 11, wherein, for each dual-lift mechanism:

that dual-lift mechanism further includes a spring, the first lifter structure of that dual-lift mechanism is a tube with a flanged end, the first lifter structure of that dual-lift mechanism has a hole through the tube that has a first interior diameter, the second lifter structure for that dual-lift mechanism is a cylindrical rod having a first portion with a first diameter that is larger than the first interior diameter of the first lifter structure of that dual-lift mechanism and a second portion with a second diameter that is smaller than the first interior diameter of the first lifter structure of that dual-lift mechanism, and the second portion of the second lifter structure of that dual-lift mechanism passes through the hole in the first lifter structure of that dual-lift mechanism and through the spring of that dual-lift mechanism.

18. The apparatus of claim 17, wherein the spring of each dual-lift mechanism is compressed between the first lifter structure of that dual-lift mechanism and a surface that is fixed with respect to the common flange structure such that the first lifter structure of that dual-lift mechanism is continually pressed into contact with the first portion of the second lifter structure of that dual-lift mechanism when the first lifter structure and the second lifter structure of that dual-lift mechanism are translated such that the first contact surface of the first lifter structure of that dual-lift mechanism is moved from the first elevation to the second elevation.

19. The apparatus of claim 11, wherein, for each dual-lift mechanism, the one or more actuators for that dual-lift mechanism is a single actuator.

20. The apparatus of claim 19, wherein the single actuators are screw actuators driven by electric motors.

* * * * *